US008686765B2

(12) United States Patent
Miao et al.

(10) Patent No.: US 8,686,765 B2
(45) Date of Patent: Apr. 1, 2014

(54) DRIVER CIRCUIT

(75) Inventors: Jason Y. Miao, Sunnyvale, CA (US); Georgios Kalogerakis, Mountain View, CA (US); The'linh Nguyen, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 13/544,327

(22) Filed: Jul. 9, 2012

(65) Prior Publication Data
US 2014/0009138 A1 Jan. 9, 2014

(51) Int. Cl.
*H03B 1/00* (2006.01)
*H03K 3/00* (2006.01)

(52) U.S. Cl.
USPC ............................. 327/109; 327/108; 327/112

(58) Field of Classification Search
USPC .......................................... 327/108, 109, 112
See application file for complete search history.

(56) References Cited

U.S. PATENT DOCUMENTS

| 7,459,982 | B2 | 12/2008 | Miao |
| 2002/0109527 | A1 | 8/2002 | Enam et al. |
| 2004/0233704 | A1 | 11/2004 | Shizuki |
| 2009/0160499 | A1* | 6/2009 | Nakahara .................... 327/109 |
| 2010/0109794 | A1 | 5/2010 | Groepl et al. |

FOREIGN PATENT DOCUMENTS

| JP | 2009-219081 | 9/2009 |
| KR | 10-2007-0048524 | 5/2007 |

OTHER PUBLICATIONS

International Search Report and Written Opinion mailed Oct. 18, 2013 in related PCT Application No. PCT/US2013/049353.

* cited by examiner

*Primary Examiner* — John Poos
(74) *Attorney, Agent, or Firm* — Maschoff Brennan

(57) ABSTRACT

A circuit may include an input node configured to receive a signal and an output node configured to be coupled to a load. The circuit may also include a first circuit coupled between the input node and the output node. The first circuit may be configured to receive the signal and to drive the signal on the output node at a first voltage. The circuit may also include an active device coupled to the output node and a second circuit coupled to the active device and the input node. The second circuit may be configured to receive the signal and to drive the signal to the active device at a second voltage that is approximately equal to the first voltage.

24 Claims, 6 Drawing Sheets

DRIVER CIRCUIT

BACKGROUND

Driver circuits may be implemented to drive electrical signals generated by one circuit to another circuit over a printed circuit board (PCB) trace, through an electrical connector, or over a transmission line of some other sort. For example, a driver circuit may drive electrical signals generated by a clock and data recovery circuit to a clocked data processing device.

In some circumstances, a driver circuit may be configured with pre-drivers that amplify an electrical signal before the electrical signal is driven by the driver circuit. Additionally, in some circumstances, a driver circuit may include additional circuitry at the output nodes for sending pre and/or post tap electrical signals on the output nodes along with a driven electrical signal. The pre and/or post tap electrical signals may compensate for signal loss of a driven electrical signal as the driven electrical signal is driven to another circuit.

A driver circuit within an integrated circuit or within a particular device may consume a significant amount of the power of the integrated circuit or the particular device. In particular, a driver circuit with a pre-driver and/or additional circuitry for sending pre and/or post tap electrical signals may consume a significant amount of power of an integrated circuit or a particular device.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Some example embodiments generally relate to a driver circuit.

In an embodiment, a circuit may include an input node configured to receive a signal and an output node configured to be coupled to a load. The circuit may also include a first circuit coupled between the input node and the output node. The first circuit may be configured to receive the signal and to drive the signal on the output node at a first voltage. The circuit may also include an active device coupled to the output node and a second circuit coupled to the active device and the input node. The second circuit may be configured to receive the signal and to drive the signal to the active device at a second voltage that is approximately equal to the first voltage.

In an embodiment, a driver circuit may include an input node configured to receive a signal and an output node configured to be coupled to a load. The driver circuit may also include a first circuit coupled between the input node and the output node. The first circuit may be configured to receive the signal and to drive the signal to the load at a first voltage. The driver circuit may also include a transistor with a drain of the transistor coupled to a voltage supply, a gate coupled to an intermediate node, and a source of the transistor coupled to the output node. The driver circuit may also include a driving circuit coupled to the input node and the intermediate node. The driving circuit may be configured to receive the signal and to drive the signal to the gate of the transistor at a second voltage approximately equal to the first voltage so that a majority of a current output by the first stage is driven to the load.

In an embodiment, a method of reducing power consumption of an electrical signal driver may include receiving a signal at an input node of a driver and driving the signal on an output node of the driver at a first voltage. The output node may be coupled to a load. The method may also include generating a second voltage approximately equal to the first voltage at an intermediate node within the driver. The intermediate node may be coupled to the output node by a transistor.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description that follows or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

A more particular description of the invention will be rendered by reference to embodiments thereof, which are illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION

Some embodiments described herein may include a driver circuit. The driver circuit may include an input node configured to receive a signal and an output node configured to be coupled to a load. For example, the input node of the driver circuit may be coupled to a transimpedance amplifier within an optical transceiver or other optoelectronic module. The driver circuit may drive signals from the transimpedance amplifier to a host device coupled to the optical transceiver. The load may be a load at the host device, such as current mode logic at the host side for receiving signals from the optical transceiver.

The driver circuit may include a first circuit coupled between the input node and the output node that may be configured to drive a signal on the output node at a first voltage. The driver circuit may also include an active device coupled to the output node and a second circuit coupled to the active device and the input node. The second circuit may be configured to drive the active device at a second voltage that is approximately equal to the first voltage. By driving the active device at the second voltage that is approximately equal to the first voltage on the output, approximately all of the current output by the first circuit onto the output node may be driven to the load instead of a portion of the current being lost in the driver. By driving approximately all of the current to the load, the power consumption of the driver may be reduced. In some embodiments, approximately all of the current output by the first circuit may be equivalent to 90% or more of the current being driven to the load. In some embodiments, approximately all of the current output by the first circuit may be equivalent to all of the current output by the first circuit minus leakage currents and/or other parasitic current loses that may occur.

Figure 1:
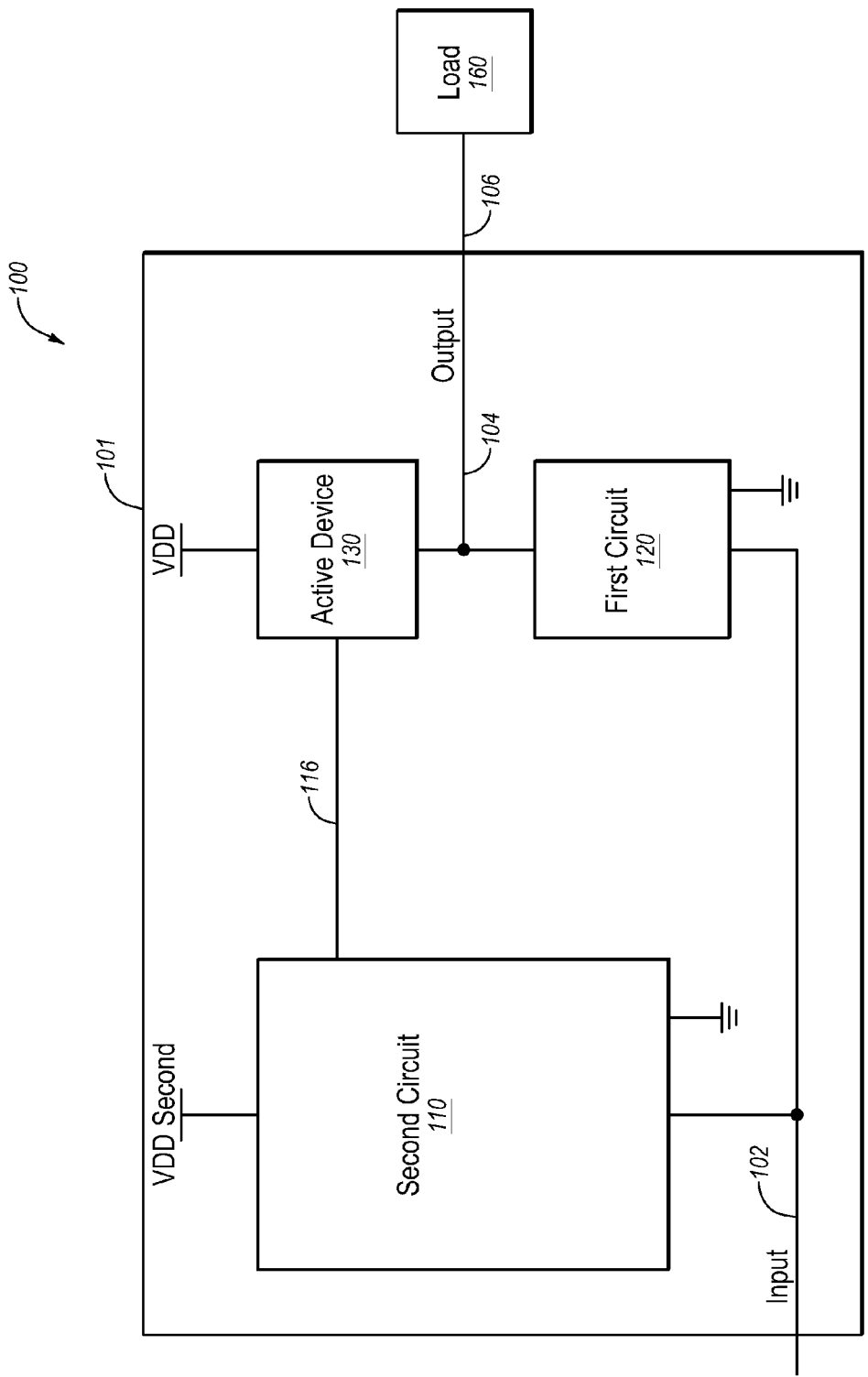
FIG. 1 illustrates an example circuit that includes a driver circuit.

FIG. 1 illustrates an example circuit 100 that includes a driver circuit 101, arranged in accordance with at least some embodiments described herein. The driver circuit 101 may include, but is not limited to, a first circuit 120, a second circuit 110, an active device 130, an input node 102, an output node 104, and an intermediate node 116. As illustrated in FIG. 1, the output node 104 may be configured to be coupled to a load 160 by an electrical lead 106. The lead 106 may be a PCB trace or some other type of electrical lead and/or electrical connector and/or some combination thereof for connecting the output node 104 and the load 160. Alternately or additionally, the lead 106 may be a transmission line that couples the output node 104 to the load 160.

The input node 102 may be coupled to the second circuit 110 and to the first circuit 120. The first circuit 120 and the active device 130 may both be coupled to the output node 104. The second circuit 110 and the active device 130 may be coupled through the intermediate node 116. The active device 130 may be an active circuit element, such as a transistor or other circuit element.

The input node 102 of the driver circuit 101 may be configured to receive a signal. The signal may be a high speed or low speed signal. For example, in some embodiments, the signal may be a 200 megabits/second signal, a 500 megabits/second signal, a 1 gigabit/second signal (Gb/s), a 10 Gb/s signal, a 20 Gb/s signal, a 40 Gb/s signal, among others. In some embodiments, the input node 102 may be configured to receive a differential signal pair.

The output node 104 may be configured to receive a signal from the first circuit 120 and to transmit the signal to the load 160. The load 160 may be any type of load and may have any impedance. For example, in some embodiments, the load 160 may be current mode logic termination that is implemented with a 50 ohm resistor.

The first circuit 120 may receive a signal from the input node 102 and may be configured to drive the signal to the load 160 by way of the output node 104. The first circuit 120 may also boost the current and/or voltage of the signal as the first circuit 120 drives the signal on the output node 104. The first circuit 120 may be configured to drive the signal at a predetermined voltage and/or with a predetermined current. For example, the first circuit 120 may be configured to drive the signal at 1 volt with a current of 20 milliamps.

In some embodiments, the first circuit 120 may drive the signal at a predetermined voltage and/or at a predetermined current based on the load 160. For example, the load 160 may require a signal to have a minimum voltage level to allow for reception of the signal without errors. In these and other embodiments, the first circuit 120 may drive the signal at or higher than the minimum voltage level.

The second circuit 110 may be configured to receive the signal from the input node 102 and to drive the active device 130 at the intermediate node 116 with the signal at a voltage level that is approximately equal to the voltage level of the signal at the output node 104. By maintaining a voltage level at the intermediate node 116 that is approximately equal to the voltage level of the signal at the output node 104, a majority of or approximately all of the current provided by the first circuit 120 to the output node 104 may be driven to the load 160. The first circuit 120 may provide current to the output node 104 by either sourcing or sinking the current. The second circuit 110 may be configured to be coupled to a power supply VDD Second and the active device 130 may be configured to be coupled to a power supply VDD. In some embodiments, the VDD Second and the VDD may be the same voltage. In some embodiments, the VDD Second and the VDD may be different voltages. In particular, the VDD second may be higher than the VDD. In these and other embodiments, having the VDD Second higher than the VDD may reduce the power consumption of the driver circuit 101.

By providing the majority of or approximately all of the current provided by the first circuit 120 to the load 160, the power consumption of the driver circuit 101 may be reduced as compared to a driver circuit that splits the current provided by a corresponding first circuit between a corresponding load and other circuit elements within the driver circuit.

For example, known driver circuits do not include circuit elements corresponding to the second circuit 110 and the active device 130 of the driver circuit 101. These known driver circuits may instead include a resistor or other passive circuit element(s) coupled between a voltage supply (hereinafter VDD) and an output node and a driving circuit coupled to the output node, with the output node coupled to a load. The current provided by the driving circuit when driving a signal to the load may be divided between the resistor and/or other passive circuit elements and the load. As a result, the driving circuit may have to provide twice the current required by the load so that the load receives its required current. Providing twice the current to the driver circuits increases the power consumption of these driver circuits. In contrast, the driver circuit 101 is configured so that a majority of or approximately all of the current provided by the first circuit 120 is provided to the load 160, reducing the power consumption of the driver circuit 101 as compared to the known driver circuits discussed above. In some embodiments, the power consumption of the driver circuit 101 may be reduced by as much as a factor of two as compared to the known driver circuits discussed above.

The first circuit 120 and the second circuit 110 may include various circuit elements. For example, the first circuit 120 may include an amplifier to drive the signal on the output node 104. Alternately or additionally, the second circuit 110 may include an amplifier to drive the signal on the intermediate node 110.

In some embodiments, the driver circuit 101 may be configured to drive a differential pair of signals. In these and other embodiments, the signal discussed above may be one of the signals of the differential pair. In these and other embodiments, the first circuit 120 may include an $F_T$ doubler circuit. An $F_T$ doubler circuit may be a circuit that approximately reduces its input capacitance by half at a given frequency. Alternately or additionally, the driver circuit 101 may include various other passive or active circuit elements. For example, the driver circuit 101 may include additional capacitors, resistors, transistors, inductors, or other circuit elements. Alternately or additionally, additional circuits may be coupled to the driver circuit 101.

Figure 2:
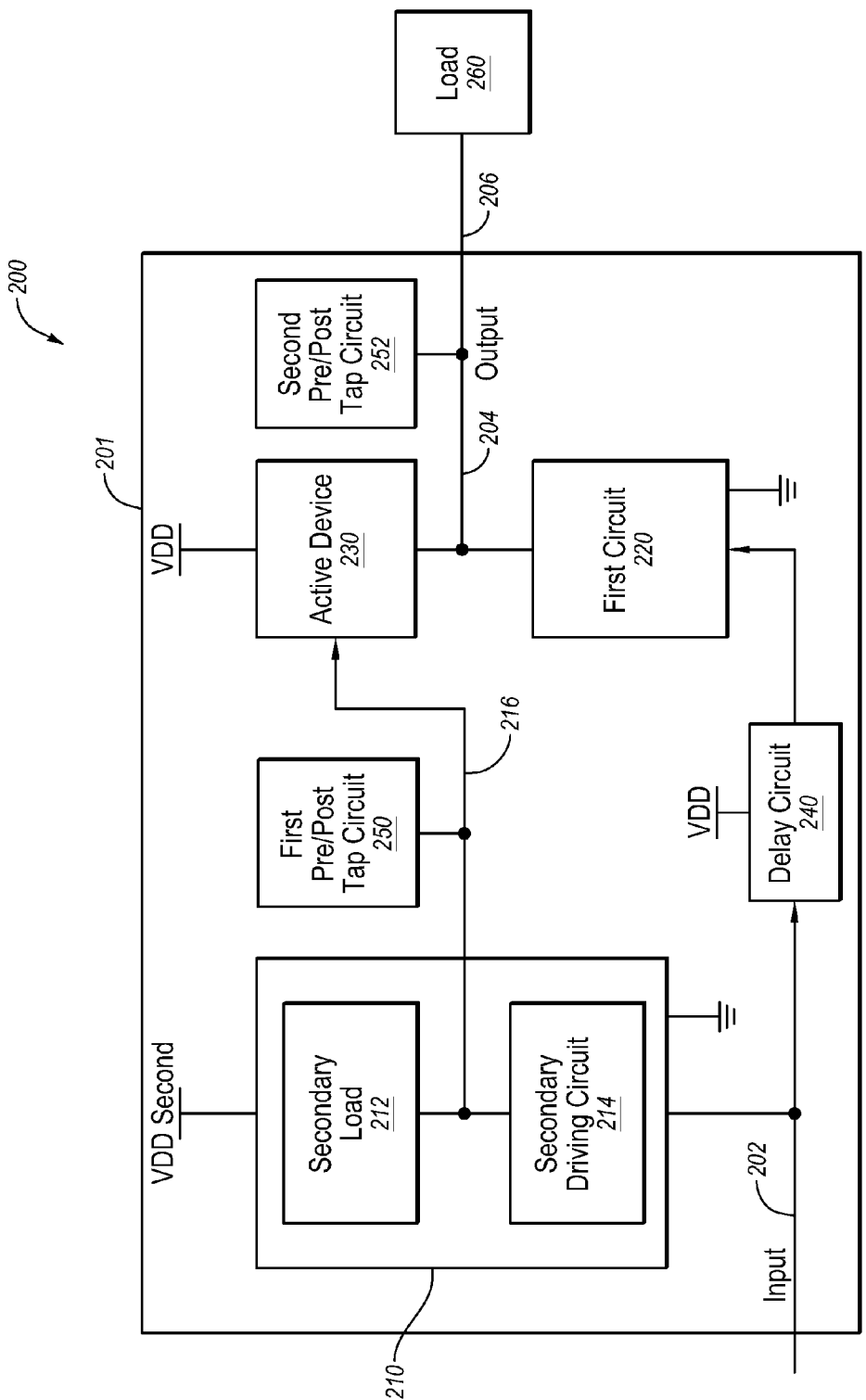
FIG. 2 illustrates another example circuit that includes a driver circuit.

FIG. 2 illustrates another example circuit 200 that includes a driver circuit 201, arranged in accordance with at least some embodiments described herein. The driver circuit 201 may include, but is not limited to, a first circuit 220, a second circuit 210, which may include a secondary load 212 and a secondary driving circuit 214, an active device 230, a delay circuit 240, a first pre/post tap circuit 250, a second pre/post tap circuit 252, an input node 202, an output node 204, and an intermediate node 216. As illustrated in FIG. 2, the output node 204 may be configured to be coupled to a load 260 by an electrical lead 206. The lead 206 may be a PCB trace or some other type of electrical lead and/or electrical connector and/or some combination thereof for connecting the output node 204 and the load 260.

The input node 202 may be coupled to the secondary driving circuit 214 and the delay circuit 240. The delay circuit 240 may be coupled to the first circuit 220. The first circuit 220 and the active device 230 may both be coupled to the output node 204. The secondary driving circuit 214, the secondary load 212, and the active device 230 may be coupled by way of the intermediate node 216. The secondary load 212 and the active device 230 may be coupled to VDD. The first pre/post tap circuit 250 may be coupled to the intermediate node 216 and the second pre/post tap circuit 252 may be coupled to the output node 204. In some embodiments, the circuit 200 may not include the second pre/post tap circuit 252. In these and other embodiments, the first pre/post tap circuit 250 may be coupled to both the intermediate node 216 and the output node 204. Alternately or additionally, the circuit 200 may include multiple pre/post tap circuits coupled to the intermediate node 216 and/or the output node 204.

The input node 202, the output node 204, the first circuit 220, and the load 260 maybe be similar to and/or correspond to the input node 102, the output node 104, the first circuit 110, and the load 160, respectively of FIG. 1.

The input node 202 may be configured to receive a signal, such as a high speed or low-speed signal or a differential signal pair, and to pass the signal to the delay circuit 240 and to the secondary driving circuit 214. The output node 204 may be configured to receive a signal from the first circuit 220 and to transmit the signal to the load 260.

The first circuit 220 may receive a signal from the delay circuit 240 and may be configured to drive the signal to the load 260 by way of the output node 204. The first circuit 220 may also boost the current and/or voltage of the signal as the signal is driven on the output node 204.

The second circuit 210 may be configured to receive the signal from the input node 202 and drive the active device 230 at the intermediate node 216 with the signal at a voltage level that is approximately equal to the voltage level of the signal at the output node 204. In particular, the secondary driving circuit 214 may receive the signal from the input node 202 and may drive the active device 230 and the secondary load 212. The secondary load 212 may have an impedance that corresponds to the impedance of the load 260. As a result, a voltage of the signal generated by the secondary driving circuit 214 driving the secondary load 212 may be approximately equal to a voltage of a signal on the output node 204 resulting from the first circuit 220 driving the load 260.

An impedance of the secondary load 212 may correspond to an impedance of the load 260 based on a correlation between a driving current of the secondary driving circuit 214 and a driving current of the first circuit 220. The driving current of the secondary driving circuit 214 may be a fraction of the driving current of the first circuit 220. For example, the driving current of the secondary driving circuit 214 may be ½, ⅓, ¼, ⅕, ⅙, or less of the driving current of the first driving circuit 220. To generate a signal voltage on the intermediate node 216 that approximates a signal voltage on the output node 206 with a driving current of the secondary driving circuit 214 being less than a driving circuit of the first circuit 220, the impedance of the secondary load may be larger than the load 260. In particular, the impedance of the secondary load 212 may be related to the impedance of the load based on the inverse of a ratio between a driving current of the secondary driving circuit 214 and a driving current of the first circuit 220. For example, if a driving current of the secondary driving circuit 214 is 1 milliamp and a driving current of the first circuit 220 is 5 milliamps to give a ratio of ⅕ and the impedance of the load 260 is 50 ohms, the impedance of the secondary load 212 may be the inverse of ⅕ or 5 times the impedance of the load 260, that is 250 ohms.

As discussed above with respect to FIG. 1, known driver circuits may provide twice the current required by the load so that the load receives its required current. For example, to provide a signal with 10 milliamps of current at a voltage of 1 volt to a load may require the known driver circuit to provide 20 milliamps of current. As a result, the known driver circuit may consume 20 milliwatts of power. In contrast, in some embodiments, the driver circuit 201, assuming the secondary driving circuit 214 has a driving current of ⅕ of a driving current of the first circuit 220, may use 12 milliwatts of power based on a signal voltage of 1 volt at the intermediate node 216 and the output node 204 and the first circuit 220 providing 10 milliamps of current and the secondary driving circuit 214 providing 2 milliamps of current. As a result, in these and other embodiments, the known driver circuit may use 66% more power than the driver circuit 201.

Because of the relatively higher impedances of the secondary load 212 as compared to other nodes in the driver circuit 201, the bandwidth of the second circuit 210 may be slower than other portions of the driver circuit 201 and may limit the bandwidth of the driver circuit 201. To compensate for the reduced bandwidth, the secondary load 212 may include one or more inductors, appropriately sized to provide inductive peaking at desired frequencies, to increase the bandwidth of the secondary load 212 and thus the driver circuit 201.

For a signal received on the input node 202 to traverse the secondary driving circuit 214, the secondary load 212, and the active device 230 may require more time than for the signal to traverse just the first circuit 220. In short, the signal path through the second circuit 210 may be longer than the signal path through the first circuit 220. As a result, when a signal transitions between a low level and a high level, for a period of time the voltages at the intermediate node 216 and the output node 204 may be unequal and result in an amplitude and/or a strength of the signal at the load 260 being reduced and/or skew of the signal, which may lead to signal reception errors at the load 260. To compensate for the difference in signal path lengths through the second circuit 210 and the first circuit 220, the delay circuit 240 may be used.

The delay circuit 240 may be configured to receive a signal from the input node 202 and to delay the signal before sending the signal to the first circuit 220. The delay circuit 240 may delay the signal so that a signal path between the input node 202 and the output node 204 through the first circuit 220 and through the second circuit 210 is approximately the same and/or so that the difference in path delay between the two paths is reduced or minimized. In some embodiments, the delay circuit 240 may be configured to amplify the signal. For example, the delay circuit 240 may be configured as a pre-driving circuit used to amplify the signal before sending the signal to the first circuit 220. In some embodiments, by reducing the current provided by the first circuit 220 to the output node 204, the current provided by a pre-driving circuit to the first circuit 220 may also be reduced, resulting in a further reduction of power consumption of the driver circuit 201.

The first pre/post tap circuit 250 may be configured to drive a pre-tap signal and/or a post-tap signal onto the intermediate node 216. A pre-tap signal may be a signal that corresponds to a signal that has yet to be driven by the second and first circuit 210, 220. A post-tap signal may be a signal that corresponds to a signal that has been or is currently being driven by the first and second circuits 210, 220. In some embodiments, the pre and/or post-tap signals may be time-shifted versions of a signal that is driven by the first and second circuits 210, 220. In these and other embodiments, the pre and/or post-tap signal may be used as a wave shaping signal to shape a signal transmitted from the output node 204 to the load 260. The pre and post-tap signals may assist in compensating for signal loss as a signal is transmitted from the output node 204 to the load 260.

The second pre/post tap circuit 252 may be configured to drive a pre-tap signal and/or a post-tap signal onto the output node 204. In the illustrated embodiment, the driver circuit 201 includes both the first and second pre/post tap circuits 250, 252. In these and other embodiments, the first and second pre/post tap circuits 250, 252 may transmit similar pre and post-tap signals at the same time so that a voltage level at the intermediate node 216 may approximate a voltage level at the output node 204. Alternately or additionally, the driver circuit 201 may include only one of the first or the second pre/post tap circuits 250, 252, or both the first and second pre/post tap circuits 250, 252 may be omitted from the driver circuit 201 altogether.

In some embodiments, including the first pre/post tap circuit 250 at the intermediate node 216 may result in reduced power consumption by the driver circuit 201. The reduced power consumption may be because of a signal from the first pre/post tap circuit 250 being amplified by the secondary load 212 before reaching the output node 206. Because the signal from the first pre/post tap circuit 250 is amplified, the signal generated by the first pre/post tap circuit 250 may be smaller than if the signal was output on the output node 206. Generating a smaller signal may consume less power and result in reduced power consumption of the driver circuit 201.

The first circuit 220 and the second circuit 210 may include various circuit elements. For example, the first circuit 220 may include one or more transistors, of any of various types, to drive a signal on the output node 204. Alternately or additionally, the second circuit 210 may include one or more transistors, of any of various types, to drive a signal on the intermediate node 216.

In some embodiments, the driver circuit 201 may be configured to drive a differential pair of signals. In these and other embodiments, the signal discussed above may be one of the signals of the differential pair. In these and other embodiments, the first circuit 220 may include an $F_T$-doubler circuit. Alternately or additionally, the driver circuit 201 as illustrated may include various other passive or active circuit elements. For example, the driver circuit 201 may include various additional capacitors, transistors, inductors, or other circuit elements. Alternately or additionally, additional circuits configured to adjust a signal received at the input node 202 may be coupled to the driver circuit 201.

Figure 3:
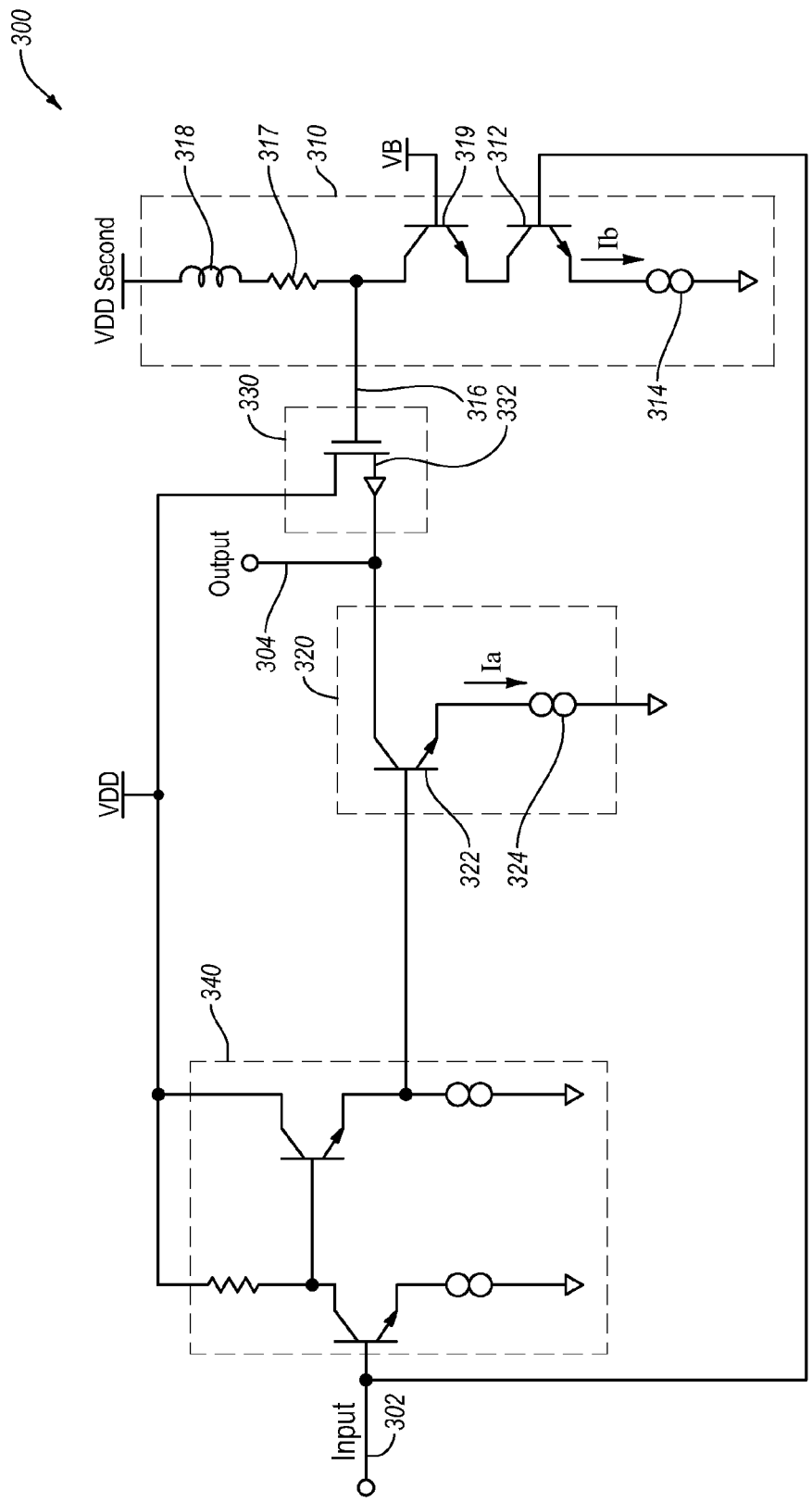
FIG. 3 illustrates an example driver circuit.

FIG. 3 illustrates an example driver circuit 300, arranged in accordance with at least some embodiments described herein. The driver circuit 300 may include, but is not limited to, a first circuit 320, a second circuit 310, an active device 330, a delay circuit 340, an input node 302, an output node 304, and an intermediate node 316.

The second circuit 310 may include transistors 312, 319. A gate of the transistor 312 may be coupled to the input node 302, a source of the transistor 312 may be coupled to a current source 314, and a drain of the transistor 312 may be coupled to a source of the transistor 319. A gate of the transistor 319 may be coupled to bias voltage (VB), which, in some embodiments, may be ground. A drain of the transistor 319 may be coupled to the intermediate node 316. The transistors 312, 319 may be configured in a cascode-type amplifier arrangement. For example, the transistor 312, 319 may be configured in a regulated cascode or some other type of cascode-type amplifier arrangement.

In some embodiments, a waveform shaping circuit that produces a shaping signal to shape a waveform of a signal received at the input 302 may be coupled to the source of the transistor 319 and the drain of the transistor 312. By providing the waveform shaping circuit at the source of the transistor 319 and the drain of the transistor 312, summing of the shaping signal and the signal received at the input 302 may be performed at the source of the transistor 319 and the drain of the transistor 312. The impedance at the source of the transistor 319 and the drain of the transistor 312 may be lower than other parts of the driver circuit 300. As a result, summing the shaping signal and the signal received at the input 302 at the source of the transistor 319 and the drain of the transistor 312 may improve a bandwidth of the driver circuit 300. Alternately or additionally, summing the shaping signal and the signal received at the input 302 at the source of the transistor 319 and the drain of the transistor 312 may reduce the power consumption of the driver circuit 300. In some embodiments, the waveform shaping circuit may be a pre and/or post-tap circuit, such as the pre and/or post-tap circuits 250, 252 of FIG. 2.

The second circuit 310 may also include a resistor 317 coupled to the intermediate node 316 and an inductor 318 coupled between VDD and the resistor 317.

The first circuit 320 may include a transistor 322, with a gate of the transistor coupled to the delay circuit 340, the source of the transistor 322 coupled to a current source 324, and a drain of the transistor 322 coupled to the output node 304. The active device 330 may include a transistor 332, with a gate of the transistor 332 coupled to the intermediate node 316, the source of the transistor 332 coupled to the output node 304, and a drain of the transistor 332 coupled to VDD. In some embodiments, a resistor and/or inductor may be placed between the source of the transistor 332 and the output node 304. The values of the resistor and/or inductor may be used to adjust the output impedance at the output node 304 so that the output impedance approximates an input impedance of a transmission line or other circuit coupled to the output node 304.

The delay circuit 340 may be coupled to the input node 302 and may include various active and passive circuit elements, such as, but not limited to, transistors, current sources, amplifiers, capacitors, resistors, and/or inductors.

The input node 302, the output node 304, the first circuit 320, the second circuit 310, and the delay circuit 340 maybe be similar to and/or correspond to the input node 202, the output node 204, the first circuit 210, the second circuit 220, and the delay circuit 240, respectively of FIG. 2.

A signal received on the input node 302 may pass through the delay circuit 340, be amplified by the transistor 322 of the first circuit 320, and may be driven by the transistor 322 onto the output node 304 at a first voltage. The signal received on the input node 302 may also be amplified by the transistors 312, 319 of the second circuit 310 and may be driven by the transistors 312, 319 onto the intermediate node 316. The signal may also pass through the resistor 317 to generate a second voltage at the intermediate node 316 that approximates the first voltage on the output node 304. Because the second voltage approximates the first voltage, the majority of or approximately all of a current Ia sourced and/or sunk by the first circuit 320 may be driven to a load (not illustrated) that may be coupled to the output node 304. A current Ib sourced and/or sunk by the second circuit 310 may be a fraction of Ia. As a result, the driver circuit 300 may have reduced power consumption as compared to known drivers that only drive approximately one-half of current on an output node to a load as discussed with respect to FIGS. 1 and 2.

The inductor 318 may be selected to generate inductive peaking at desired frequencies to broaden a bandwidth of the driver circuit 300. In some embodiments, the inductor 318 may be omitted from the driver circuit 300. In some embodiments, the second device 310 may not include the transistor 319.

Figure 4:
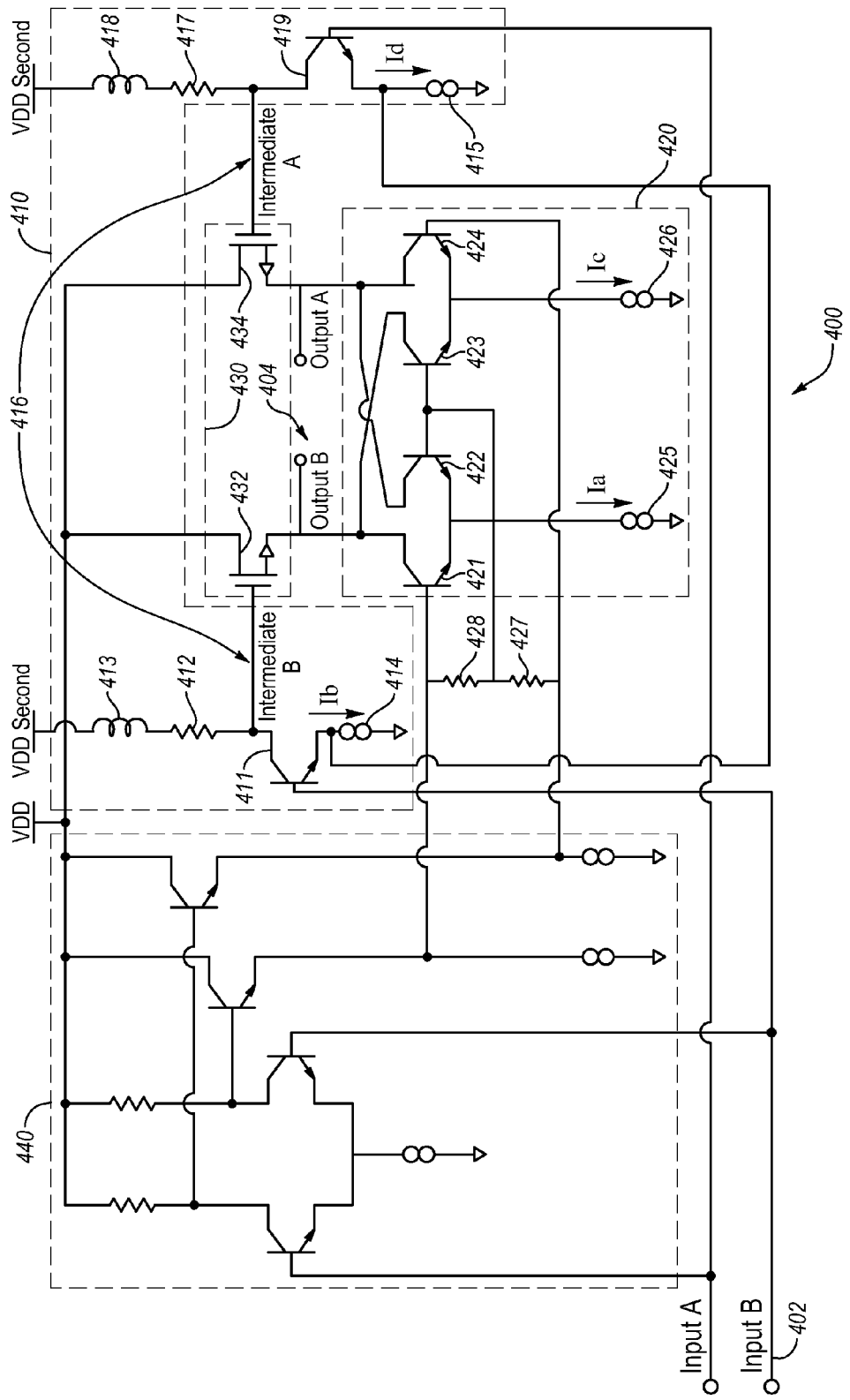
FIG. 4 illustrates another example driver circuit.

FIG. 4 illustrates another example driver circuit 400, arranged in accordance with at least some embodiments described herein. The driver circuit 400 may include, but is not limited to, a first circuit 420, a second circuit 410, an active device 430, a delay circuit 440, an input node 402, an output node 404, and an intermediate node 416.

The driver circuit 400 may be similar to the driver circuit 300, but may be configured to drive differential signals. In more detail, the input node 402 may include an input node A and an input node B. The output node 404 may include an output node A and an output node B. The intermediate node 416 may include an intermediate node A and an intermediate node B. The driver circuit 400 may be configured to receive a first signal of a differential signal pair on the input node A, pass the first signal through the intermediate node A, and output the first signal on the output node A. The driver circuit 400 may also be configured to receive a second signal of the differential signal pair on the input node B, pass the second signal through the intermediate node B, and output the second signal on the output node B.

The input node 402, the output node 404, the first circuit 420, the second circuit 410, and the delay circuit 440 maybe be similar to and/or correspond to the input node 202, the output node 204, the first circuit 210, the second circuit 220, and the delay circuit 240, respectively of FIG. 2.

The second circuit 410 may include a first portion coupled between input A and intermediate node A of the driver circuit 400. The first portion may include a transistor 419, with a gate of the transistor 419 coupled to the input node A, a source of the transistor 419 coupled to a current source 415, and a drain of the transistor 419 coupled to the intermediate node A. The first portion of the second circuit 410 may also include a resistor 417 coupled to the intermediate node A and an inductor 418 coupled between VDD and the resistor 417.

The second circuit 410 may also include a second portion coupled between the input B and the intermediate node B of the driver circuit 400. The second portion may include a transistor 411, with a gate of the transistor 411 coupled to the input node B, a source of the transistor 411 coupled to a current source 414, and a drain of the transistor 411 coupled to the intermediate node B. The source of the transistor 411 may also be coupled to the source of the transistor 419. The second portion of the second circuit 410 may also include a resistor 412 coupled to the intermediate node B and an inductor 413 coupled between VDD and the resistor 412.

The first circuit 420 may include an $F_T$ doubler circuit and may receive the differential signal pair from the delay circuit 430. The first circuit 420 may include transistors 424, 423, 422, 421, current sources 425, 426, and resistors 427, 428. A gate of the transistor 424 may be coupled to a node of the delay circuit 440 so as to receive the first signal of the differential signal pair received at the input node A. A source of the transistor 424 may be coupled to a source of transistor 423 and to the current source 426. A drain of the transistor 424 may be coupled to the output A and to a drain of the transistor 422.

A gate of the transistor 421 may be coupled to a node of the delay circuit 440 so as to receive the second signal of the differential signal pair received at the input node B. A source of the transistor 421 may be coupled to a source of transistor 422 and to the current source 425. A drain of the transistor 421 may be coupled to the output node B and to a drain of the transistor 423. Gates of the transistors 422, 423 may be coupled and to a node coupling the resistors 428 and 427. A node of the resistor 428 not coupled to the gates of the transistors 422, 423 may be coupled to the gate of transistor 421. A node of the resistor 427 not coupled to the gates of the transistors 422, 423 may be coupled to the gate of transistor 424.

The active device 430 may include a transistor 434 coupled between the intermediate node A and the output node A. A gate of the transistor 434 may be coupled to the intermediate node A, a source of the transistor 434 may be coupled to output node A, and a drain of the transistor 434 may be coupled to VDD. In some embodiments, a resistor and/or inductor may be placed between the source of the transistor 434 and the output node A. The values of the resistor and/or inductor may be used to adjust the output impedance at the output node A so that the output impedance approximates an input impedance of a transmission line or other circuit coupled to the output node A.

The active device 430 may also include a transistor 432 coupled between the intermediate node B and the output node B. A gate of the transistor 432 may be coupled to the intermediate node B, a source of the transistor 432 may be coupled to output node B, and a drain of the transistor 432 may be coupled to VDD. In some embodiments, a resistor and/or inductor may be placed between the source of the transistor 432 and the output node B. The values of the resistor and/or inductor may be used to adjust the output impedance at the output node B so that the output impedance approximates an input impedance of a transmission line or other circuit coupled to the output node B.

The delay circuit 440 may be coupled to the input node 402 and the first circuit 420. The delay circuit 440 may include various active and passive circuit elements, such as transistors, current sources, amplifiers, capacitors, resistors, inductors, among others configured to delay the first and second signals. The delay circuit 440 may also be configured to act as a pre-driver for the first circuit 420 and may amplify the first and second signals.

The first signal of the differential signal pair may be received on the input node A and may pass through the delay circuit 440, be amplified by the transistor 424, and driven by the transistor 424 onto the output node A at a first voltage. The first signal received on the input node A may also be amplified by the transistor 419 and driven by the transistor 419 onto the intermediate node A. The first signal may also pass through the resistor 417 to generate a second voltage at the intermediate node A that approximates the first voltage on the output node A. Because the second voltage approximates the first voltage, the majority of or approximately all of a current Ic sourced and/or sunk by a portion of the first circuit 420 may be driven to a load (not illustrated) that may be coupled to the output node A. A current Id sourced and/or sunk by the first portion of the second circuit 410 may be a fraction of Ic.

The second signal of the differential signal pair may be received on the input node B and may pass through the delay circuit 440, be amplified by the transistor 421, and driven by the transistor 421 onto the output node B at a third voltage.

The second signal received on the input node B may also be amplified by the transistor 411 and driven by the transistor 411 onto the intermediate node B. The second signal may also pass through the resistor 412 to generate a fourth voltage at the intermediate node B that approximates the third voltage on the output node B. Because the fourth voltage approximates the third voltage, the majority of or approximately all of a current Ia sourced and/or sunk by a portion of the first circuit 420 may be driven to a load (not illustrated) that may be coupled to the output node B. A current Ib sourced and/or sunk by the first portion of the second circuit 410 may be a fraction of Ia.

Because the majority of or approximately all of the currents Ia and Ic are driven to a load and the currents Ib and Id are fractions of Ia and Ic respectively, the driver circuit 400 may have a reduced power consumption as compared to known drivers that only drive approximately one-half of a current on an output node to a load as discussed with respect to FIGS. 1 and 2.

The inductors 413, 418 may be selected to generate inductive peaking at desired frequencies to broaden the bandwidth of the driver circuit 400. Optionally, the driver circuit 400 may omit the inductors 413, 418. In some embodiments, the second device 410 may include a transistor between the transistor 411 and the intermediate node B that form a cascode type amplifier. The device 410 may also include a transistor between the transistor 419 and the intermediate node A that forms a cascode type amplifier. The additional transistors may be similar to the transistor 319 of FIG. 3.

In FIGS. 3 and 4, the transistors 312, 322, 411, 419, 421, 422, 423, 424 and the transistors within the delay circuits 340, 440 are illustrated as n channel bi-polar junction transistors (BJTs). The transistors 332, 432, 434 are illustrated as n channel metal-oxide-semiconductor field-effect transistors (MOSFETs). By using MOSFETs for transistors 332, 432, 434 within the active devices 330, 430, respectively, a transconductance (gm) of each of the transistors 332, 432, 434 may be scaled to produce a desired and/or predetermined output impedance for the respective output(s) of the driver circuits 300, 400 of FIGS. 3 and 4. As a result, additional resistors may not be used to produce the desired output impedance for the respective output(s) of the driver circuits 300, 400 of FIGS. 3 and 4. By not using additional resistors, the headroom margin of the active devices 330, 430 may be reduced and thus the power consumption of the driver circuits 300, 400 may be reduced.

Note that the above description with respect to FIGS. 3 and 4 uses the nomenclature gate, drain, and source generically to represent different terminals of the BJTs and MOSFETs illustrated in FIGS. 3 and 4. The use of the names gate, drain, and source may be used to describe generically the terminals of a MOSFET, BJT, or other types of transistors such as, as a junction gate field-effect transistors (JFET) and insulated gate bipolar transistors.

In some embodiments, the transistors 312, 322, 411, 419, 421, 422, 423, 424 and the transistors within the delay circuits 340, 440 in FIGS. 3 and 4 may be MOSFETs. Alternately or additionally, the transistors 330, 432, 434 in FIGS. 3 and 4 may be BJTs. Alternately or additionally, the transistors 312, 322, 330, 432, 434, 411, 419, 421, 422, 423, 424 and the transistors within the delay circuits 340, 440 of FIGS. 3 and 4 may be (JFET), insulated gate bipolar transistors, or some combination of JFETs, insulated gate bipolar transistors, MOSFETs, and BJTs.

Additionally, FIGS. 3 and 4 depict the transistors as being n-channel transistors. P-channel transistors or some combination of n-channel and p-channel transistors may also be used. In some embodiments, additional active and/or passive circuit elements may be included in the driver circuits 300, 400.

Figure 5:
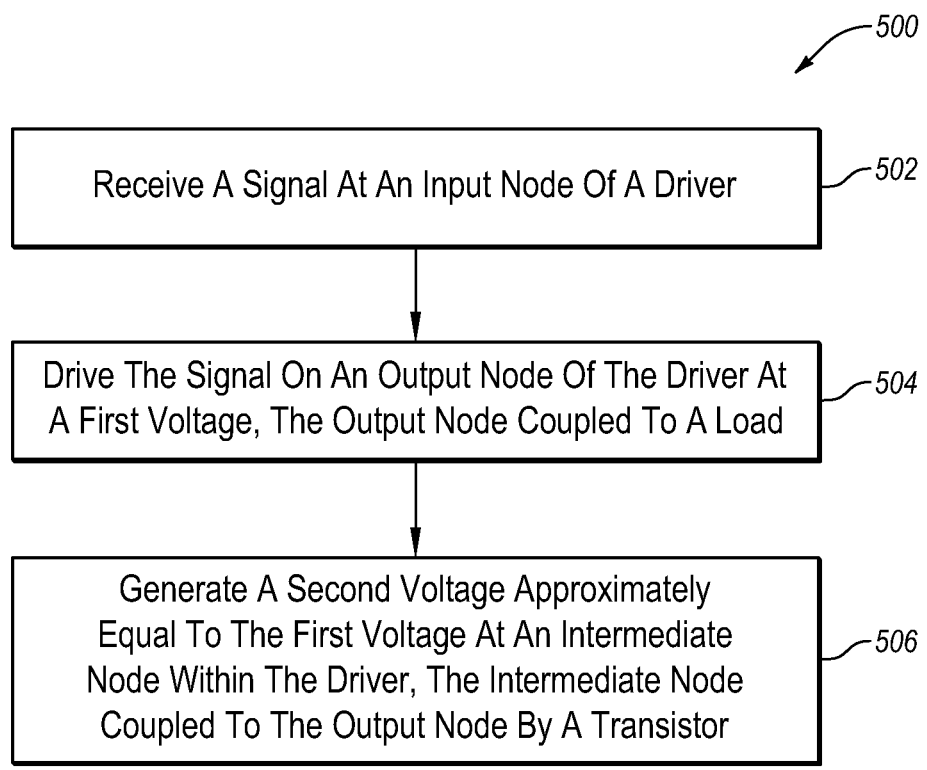
FIG. 5 is a flow chart of an example method of reducing power consumption of a an electrical signal driver.

FIG. 5 is a flow chart of an example method of reducing power consumption of an electrical signal driver, arranged in accordance with at least some embodiments described herein. The method 500 may be implemented, in some embodiments, by a driver circuit, such as the driver circuit 300 of FIG. 3. Although illustrated as discrete blocks, various blocks may be divided into additional blocks, combined into fewer blocks, or eliminated, depending on the desired implementation.

The method 500 may begin at block 502 at which a signal at an input node of a driver may be received.

In block 504, the signal on an output node of the driver may be driven at a first voltage. The output node may be coupled to a load.

In block 506, a second voltage approximately equal to the first voltage at an intermediate node within the driver may be generated. The intermediate node may be coupled to the output node by a transistor. In some embodiments, the second voltage may be generated by driving a secondary load.

In some embodiments, a first ratio between an intermediate current driving the secondary load and an output current driving the load and a second ratio between an impedance of the load and an impedance of the secondary load may be substantially equal.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 500 may further include introducing a pre-tap signal or a post-tap signal at the intermediate node. The method 500 may further include delaying the signal before driving the signal on the output node of the driver.

Figure 6:
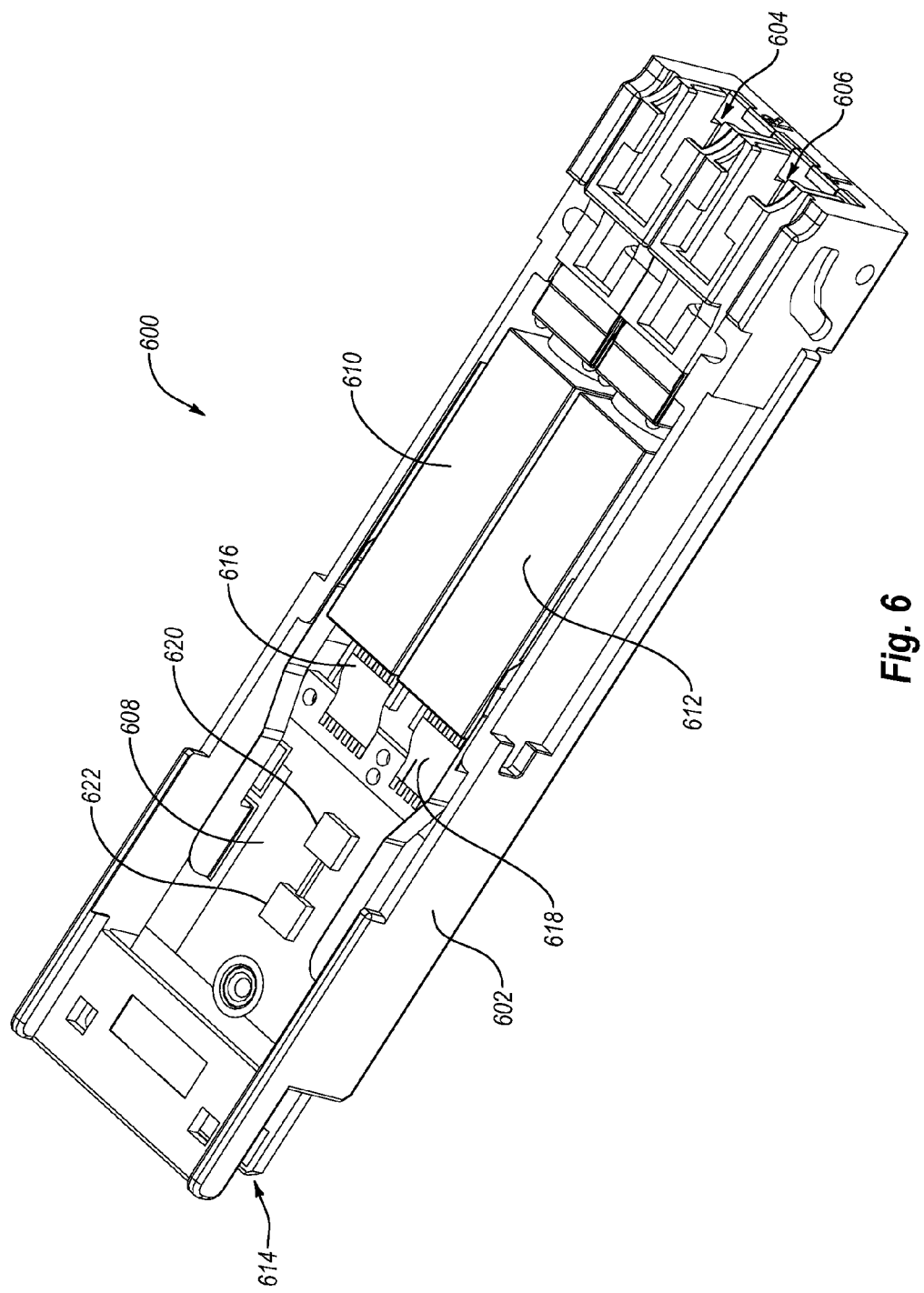
FIG. 6 is a perspective view of an example optoelectronic module that may include a driver circuit.

FIG. 6 is a perspective view of an example optoelectronic module 600 (hereinafter "module 600") that may include a driver circuit 622, arranged in accordance with at least some embodiments described herein. The module 600 may be configured for use in transmitting and receiving optical signals in connection with a host device (not shown).

As illustrated, the module 600 may include, but is not limited to, a bottom housing 602; a receive port 604 and a transmit port 606, both defined in the bottom housing 602; a PCB 608 positioned within the bottom housing 602, the PCB 608 having a driver circuit 622 and a first circuit 620 positioned hereon; and a receiver optical subassembly (ROSA) 610 and a transmitter optical subassembly (TOSA) 612 also positioned within the bottom housing 602. An edge connector 614 may be located on an end of the PCB 608 to enable the module 600 to electrically interface with the host device. As such, the PCB 608 facilitates electrical communication between the host device and the ROSA 610 and TOSA 612.

The module 600 may be configured for optical signal transmission and reception at a variety of data rates including, but not limited to, 1 Gb/s, 10 Gb/s, 20 Gb/s, 40 Gb/s, 100 Gb/s, or higher. Furthermore, the module 600 may be configured for optical signal transmission and reception at various distinct wavelengths using wavelength division multiplexing (WDM) using one of various WDM schemes, such as Coarse WDM, Dense WDM, or Light WDM. Furthermore, the module 600 may be configured to support various communication protocols including, but not limited to, Fibre Channel and High Speed Ethernet. In addition, although illustrated in a particular form factor in FIG. 6, more generally, the module 600 may be configured in any of a variety of different form factors including, but not limited to, the Small Form-factor Pluggable (SFP), the enhanced Small Form-factor Pluggable (SFP+), the 10 Gigabit Small Form Factor Pluggable (XFP), the C Form-factor Pluggable (CFP) and the Quad Small Form-factor Pluggable (QSFP) multi-source agreements (MSAs).

The ROSA 610 may house one or more optical receivers, such as photodiodes, that are electrically coupled to an electrical interface 616. The one or more optical receivers may be configured to convert optical signals received through the receive port 604 into corresponding electrical signals that are relayed to the host device through the electrical interface 616 and the PCB 608. The TOSA 612 may house one or more optical transmitters, such as lasers, that are electrically coupled to another electrical interface 618. The one or more optical transmitters may be configured to convert electrical signals received from host device by way of the PCB 608 and the electrical interface 618 into corresponding optical signals that are transmitted through the transmit port 606.

The driver circuit 622, which may be similar to and/or correspond to the driver circuits 101, 201, 300, or 400 of FIG. 1, 2, 3, or 4 respectively, may be configured to drive electrical signals relayed to the PCB 608 through the electrical interface 616 to the host device. In some embodiments, the electrical signals may pass through the first circuit 620 before being driven by the driver circuit 622. In these and other embodiments, the first circuit 620 may be a clock and data recovery circuit. In some embodiments, the module 600 may omit the first circuit 620. In these and other embodiments, the driver circuit 620 may drive the electrical signals from the PCB 608 to the TOSA 612. In some embodiments, a driver circuit, such as the driver circuits 101, 201, 300, or 400 of FIG. 1, 2, 3, or 4 respectively may be incorporated into the ROSA 610 and may be used to drive electrical signals from the ROSA 610 through the electrical interface 616 to the PCB 608.

The module 600 illustrated with respect to FIG. 6 is one architecture in which embodiments of the present disclosure may be employed. It should be understood that this specific architecture is only one of countless architectures in which embodiments may be employed. The scope of the present disclosure is not intended to be limited to any particular architecture or environment.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit comprising:
an input node configured to receive a signal;
an output node configured to be coupled to a load;
a first circuit coupled between the input node and the output node, the first circuit configured to receive the signal and drive the signal on the output node at a first voltage when the signal is at a first level;
an active device coupled to the output node; and
a second circuit coupled to the active device and the input node; the second circuit configured to receive the signal and to drive the signal to the active device at a second voltage when the signal is at the first level, the second voltage being approximately equal to the first voltage.

2. The circuit of claim 1, wherein approximately all of a current output by the first circuit is driven to the load.

3. The circuit of claim 1, wherein the second circuit comprises a secondary driving circuit coupled to a secondary load at an intermediate node, the active device coupled to the second circuit at the intermediate node.

4. The circuit of claim 3, wherein the secondary load comprises an inductor.

5. The circuit of claim 3, wherein the secondary driving circuit comprises a first transistor coupled to a second transistor at a secondary driving circuit node, the first and second transistors configured in a cascode arrangement.

6. The circuit of claim 5, further comprising a first pre-tap signal circuit or a first post-tap signal circuit coupled to the secondary driving circuit node.

7. The circuit of claim 1, further comprising a first pre-tap signal circuit or a first post-tap signal circuit coupled to an intermediate node between the second circuit and the active device.

8. The circuit of claim 5, further comprising a second pre-tap signal circuit or a second post-tap signal circuit coupled to the output node.

9. The circuit of claim 1, wherein the active device comprises a transistor comprising a gate, a source, and a drain, wherein the gate is coupled to the second circuit, the source is coupled to the output node, and the drain is coupled to a voltage supply.

10. The circuit of claim 9, wherein the transistor is a metal-oxide-semiconductor field-effect transistor, wherein the transconductance of the transistor is scaled to produce a predetermined output impedance for the output node.

11. The circuit of claim 1, further comprising a delay circuit coupled between the input node and the first circuit, the delay circuit configured to delay the signal so that a first time for the signal to traverse the second circuit and the active device is approximately equal to a second time for the signal to traverse the delay circuit and the first circuit.

12. The circuit of claim 1, wherein the delay circuit comprises a pre-driving circuit for the first circuit.

13. The circuit of claim 1, wherein the signal is a first signal in a differential signal pair.

14. The circuit of claim 13, wherein the first circuit comprises an $F_T$ doubler circuit.

15. The circuit of claim 1, wherein second circuit is coupled to a first voltage supply and the active device is coupled to a second voltage supply, wherein the first voltage supply has a higher voltage than the second voltage supply.

16. A driver circuit, the driver circuit comprising:
an input node configured to receive a signal;
an output node configured to be coupled to a load;
a first circuit coupled between the input node and the output node and configured to receive the signal and drive the signal on the output node at a first voltage when the signal is at a first level;
a transistor comprising a source, a drain, and a gate, the drain coupled to a voltage supply, the gate coupled to an intermediate node, and the source coupled to the output node; and
a driving circuit coupled to the input node and the intermediate node, the driving circuit configured to receive the signal and to drive the signal to the gate of the transistor at a second voltage when the signal is at the first level, the second voltage being approximately equal to the first voltage so that a majority of a current output by the first circuit is driven to the load.

17. The driver circuit of claim 16, further comprising a second load coupled between the intermediate node and the voltage supply.

18. The driver circuit of claim 16, further comprising a delay circuit between the input node and the first circuit, the delay circuit comprising a pre-driving circuit for the first circuit.

19. The driver circuit of claim 16, wherein the signal is a first signal in a differential signal pair.

20. A method of reducing power consumption of an electrical signal driver, the method comprising:
   receiving a signal at an input node of a driver;
   driving the signal on an output node of the driver at a first voltage when the signal is at a first level, the output node configured to be coupled to a load; and
   generating a second voltage approximately equal to the first voltage at an intermediate node within the driver when the signal is at the first level, the intermediate node being coupled to the output node by a transistor.

21. The method of claim 20, further comprising delaying the signal before driving the signal on the output node of the driver.

22. The method of claim 20, wherein generating the second voltage comprises driving a secondary load.

23. The method of claim 22, wherein a first ratio between an intermediate current driving the secondary load and an output current driving the load and a second ratio between an impedance of the load and an impedance of the secondary load are substantially equal.

24. The method of claim 20, further comprising introducing a pre-tap signal or a post-tap signal at the intermediate node to reduce a power consumption of the driver.

* * * * *

UNITED STATES PATENT AND TRADEMARK OFFICE
CERTIFICATE OF CORRECTION

| | |
|---|---|
| PATENT NO. | : 8,686,765 B2 |
| APPLICATION NO. | : 13/544327 |
| DATED | : April 1, 2014 |
| INVENTOR(S) | : Miao et al. |

Page 1 of 1

It is certified that error appears in the above-identified patent and that said Letters Patent is hereby corrected as shown below:

In the Specification

In Column 4, Line 48, delete "node 110." and insert -- node 116. --, therefor.

In Column 5, Lines 28-29, delete "first circuit 110," and insert -- first circuit 120, --, therefor.

In Column 7, Lines 3-4, delete "first and second first circuits 210, 220." and insert -- first and second circuits 220, 210. --, therefor.

In Column 8, Lines 51-52, delete "maybe be" and insert -- may be --, therefor.

In Column 8, Line 53, delete "circuit 210, the second circuit 220," and insert -- circuit 220, the second circuit 210, --, therefor.

In Column 9, Line 38, delete "circuit 210, the second circuit 220," and insert -- circuit 220, the second circuit 210, --, therefor.

Signed and Sealed this
Third Day of March, 2015

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,686,765 B2 | Page 1 of 1 |
| APPLICATION NO. | : 13/544327 | |
| DATED | : April 1, 2014 | |
| INVENTOR(S) | : Miao et al. | |

It is certified that error appears in the above-identified patent and that said Letters Patent is hereby corrected as shown below:

IN THE SPECIFICATION

Column 7, Line 6, delete "210, 220" and insert -- 220, 210 --, therefore.

Signed and Sealed this
Sixth Day of October, 2015

Michelle K. Lee
*Director of the United States Patent and Trademark Office*